(12) United States Patent
Hematy et al.

(10) Patent No.: US 9,479,325 B1
(45) Date of Patent: Oct. 25, 2016

(54) REDUCED FREQUENCY BACKWARDS CLOCK FOR ISOLATED SIGMA-DELTA MODULATORS

(71) Applicant: Maxim Integrated Products, Inc., San Jose, CA (US)

(72) Inventors: Arman Hematy, San Jose, CA (US); Jonathan R. Strode, Los Altos, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 340 days.

(21) Appl. No.: 14/140,743

(22) Filed: Dec. 26, 2013

Related U.S. Application Data

(60) Provisional application No. 61/811,361, filed on Apr. 12, 2013.

(51) Int. Cl.
*H04B 10/00* (2013.01)
*H04L 7/00* (2006.01)

(52) U.S. Cl.
CPC .................. *H04L 7/0075* (2013.01)

(58) Field of Classification Search
CPC ... H04L 7/0075; H04J 3/0655; H04J 3/0685; H04J 3/0688; H04B 10/5055; H04B 10/40; H04B 10/504; H04B 10/66; H03L 2207/06; H03L 2207/50; H03M 1/0827; H03M 1/12; H03M 3/458
USPC ................. 398/135–139, 154, 155, 162–164
See application file for complete search history.

(56) References Cited

U.S. PATENT DOCUMENTS

| | | | |
|---|---|---|---|
| 5,822,099 A | 10/1998 | Takamatsu | |
| 6,731,967 B1 | 5/2004 | Turcott | |
| 6,990,155 B2 * | 1/2006 | Adachi | H03F 3/24 375/261 |
| 7,013,090 B2 * | 3/2006 | Adachi | H03F 3/24 398/183 |
| 7,369,067 B2 | 5/2008 | Kishi | |
| 7,526,206 B1 | 4/2009 | Rolenz | |
| 7,911,247 B2 * | 3/2011 | Xu | H03L 7/1974 327/156 |
| 7,924,965 B2 * | 4/2011 | Tseng | G06F 1/08 377/47 |
| 8,229,313 B2 | 7/2012 | Oh | |
| 8,253,506 B2 * | 8/2012 | Liu | H03L 1/023 331/117 R |
| 8,521,020 B2 | 8/2013 | Welch | |
| 8,592,742 B2 | 11/2013 | Lorello et al. | |
| 8,618,967 B2 * | 12/2013 | Nikaeen | H03M 3/458 327/141 |
| 8,692,200 B2 | 4/2014 | Tao | |
| 8,761,599 B2 * | 6/2014 | Uo | H04B 10/802 398/189 |
| 8,953,950 B2 | 2/2015 | Nazarathy et al. | |
| 9,000,675 B2 | 4/2015 | Chang | |
| 9,025,965 B2 * | 5/2015 | Lee | H03L 1/00 327/156 |

(Continued)

*Primary Examiner* — Hibret Woldekidan
(74) *Attorney, Agent, or Firm* — Advent, LLP

(57) ABSTRACT

A system includes a divider on a first side of electrically isolated circuitry for receiving a clock signal having a characteristic frequency and dividing the clock signal by a characteristic value. The system also includes an optical link coupled with the divider for receiving the divided clock signal and transmitting the divided clock signal from the first side of the electrically isolated circuitry to a second side of the electrically isolated circuitry. The system further includes a phase-locked loop on the second side of the electrically isolated circuitry. The phase-locked loop is coupled with the optical link and configured to receive the divided clock signal from the optical link and generate a second signal at a multiple of a characteristic frequency of the divided clock signal so that the second signal comprises the characteristic frequency of the clock signal received by the divider circuitry.

15 Claims, 3 Drawing Sheets

(56) References Cited

U.S. PATENT DOCUMENTS

| | | |
|---|---|---|
| 9,306,662 B1 * | 4/2016 | Hematy ............... H04B 10/075 |
| 9,344,100 B2 * | 5/2016 | Liu ......................... H03L 7/093 |
| 2005/0070325 A1 | 3/2005 | Bellaouar |
| 2005/0213969 A1 | 9/2005 | Hakomori |
| 2008/0292325 A1 * | 11/2008 | Chen ................... H03M 1/0827 |
| | | 398/202 |
| 2009/0142076 A1 | 6/2009 | Li |
| 2009/0324231 A1 | 12/2009 | Nakano |
| 2010/0328616 A1 | 12/2010 | Silverstein |
| 2011/0243552 A1 | 10/2011 | Mitchell |
| 2012/0175504 A1 * | 7/2012 | Holland ............... H04B 10/802 |
| | | 250/214 A |
| 2013/0039648 A1 | 2/2013 | Uo |
| 2015/0341042 A1 * | 11/2015 | Balachandran ......... H03L 7/093 |
| | | 327/156 |

* cited by examiner

REDUCED FREQUENCY BACKWARDS CLOCK FOR ISOLATED SIGMA-DELTA MODULATORS

CROSS-REFERENCE TO RELATED APPLICATIONS

The present application claims the benefit under 35 U.S.C. §119(e) of U.S. Provisional Application Ser. No. 61/811,361, filed Apr. 12, 2013, and titled "REDUCED FREQUENCY BACKWARDS CLOCK FOR ISOLATED SIGMA-DELTA MODULATORS," which is herein incorporated by reference in its entirety.

BACKGROUND

Industrial and process control systems include various types of control equipment used in industrial production, such as supervisory control and data acquisition (SCADA) systems, distributed control systems (DC S), and other control equipment using, for example, programmable logic controllers (PLC). These control systems are typically used in industries including electrical, water, oil, gas, and data. Using information collected from remote stations in the field, automated and/or operator-driven supervisory commands can be transmitted to field control devices. These field devices control local operations, such as the speed of an electrical motor. Industrial control systems/process control systems may require electrical isolation between power transmission and control equipment. For example, optical equipment can be used for signal transmission to electrically isolate devices, prevent ground loops, and so forth.

SUMMARY

A system includes a divider on a first side of electrically isolated circuitry for receiving a clock signal having a characteristic frequency and dividing the clock signal by a characteristic value. The system also includes an optical link coupled with the divider for receiving the divided clock signal and transmitting the divided clock signal from the first side of the electrically isolated circuitry to a second side of the electrically isolated circuitry. The system further includes a phase-locked loop on the second side of the electrically isolated circuitry. The phase-locked loop is coupled with the optical link and configured to receive the divided clock signal from the optical link and generate a second signal at a multiple of a characteristic frequency of the divided clock signal so that the second signal comprises the characteristic frequency of the clock signal received by the divider circuitry.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

DETAILED DESCRIPTION

Figure 1:
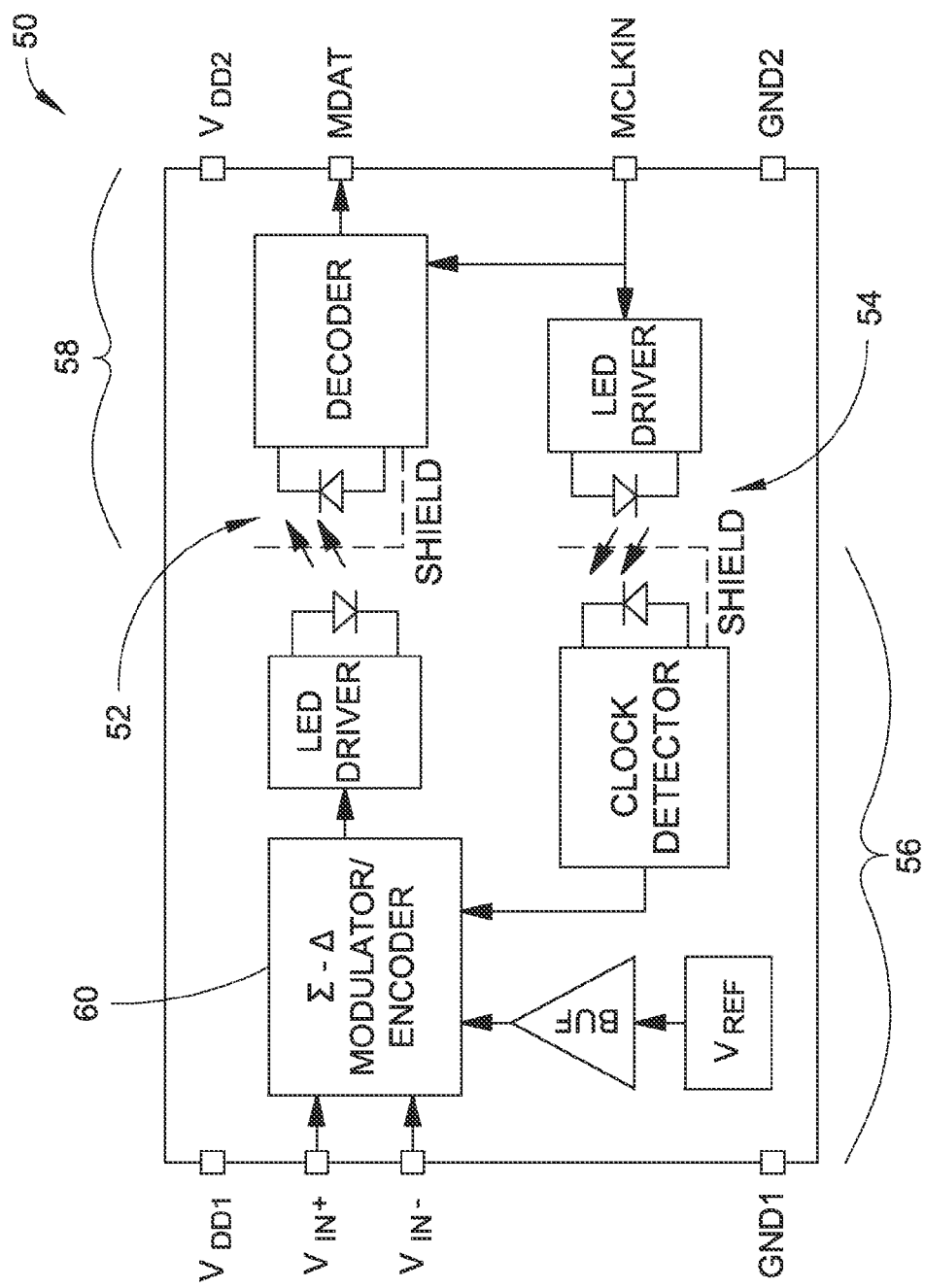
FIG. 1 is a diagrammatic illustration of a system that provides electrical isolation using optical links.

Referring generally to FIG. 1, a system 50 providing optical coupling is described. The system 50 includes two high speed, unidirectional optical links 52 and 54 that provide bidirectional communication (e.g., between a high voltage side 56 and a low voltage side 58). On the high voltage side 56, current-sense functionality is provided using a sigma-delta modulator and an associated oscillator 60. Synchronization of the oscillator 60 is achieved via a "backwards" optical link 54 that furnishes a clock signal from the low voltage side 58 to the high voltage side 56. In the configuration shown in FIG. 1, the backwards optical link 54 transmits a high speed clock signal (e.g., a twenty megahertz (20 MHz) clock signal) through the optical-coupler 54. However, a high speed backwards optical link consumes increased power, is more expensive, and has a shorter lifespan (e.g., with respect to a lower speed optical link).

Figure 2:
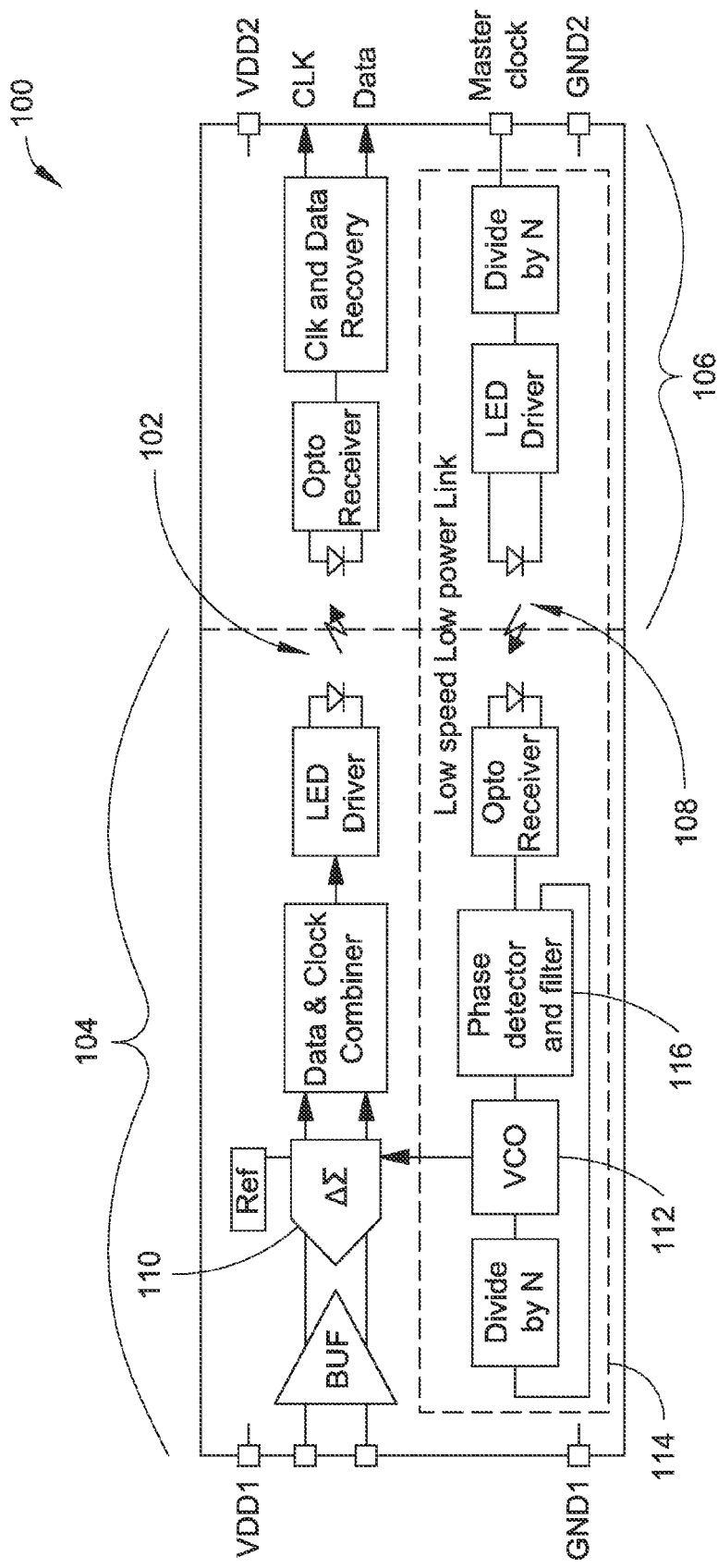
FIG. 2 is a diagrammatic illustration of a system that provides electrical isolation using a high speed optical link and a low speed optical link in accordance with an example embodiment of the present disclosure.
Figure 3:
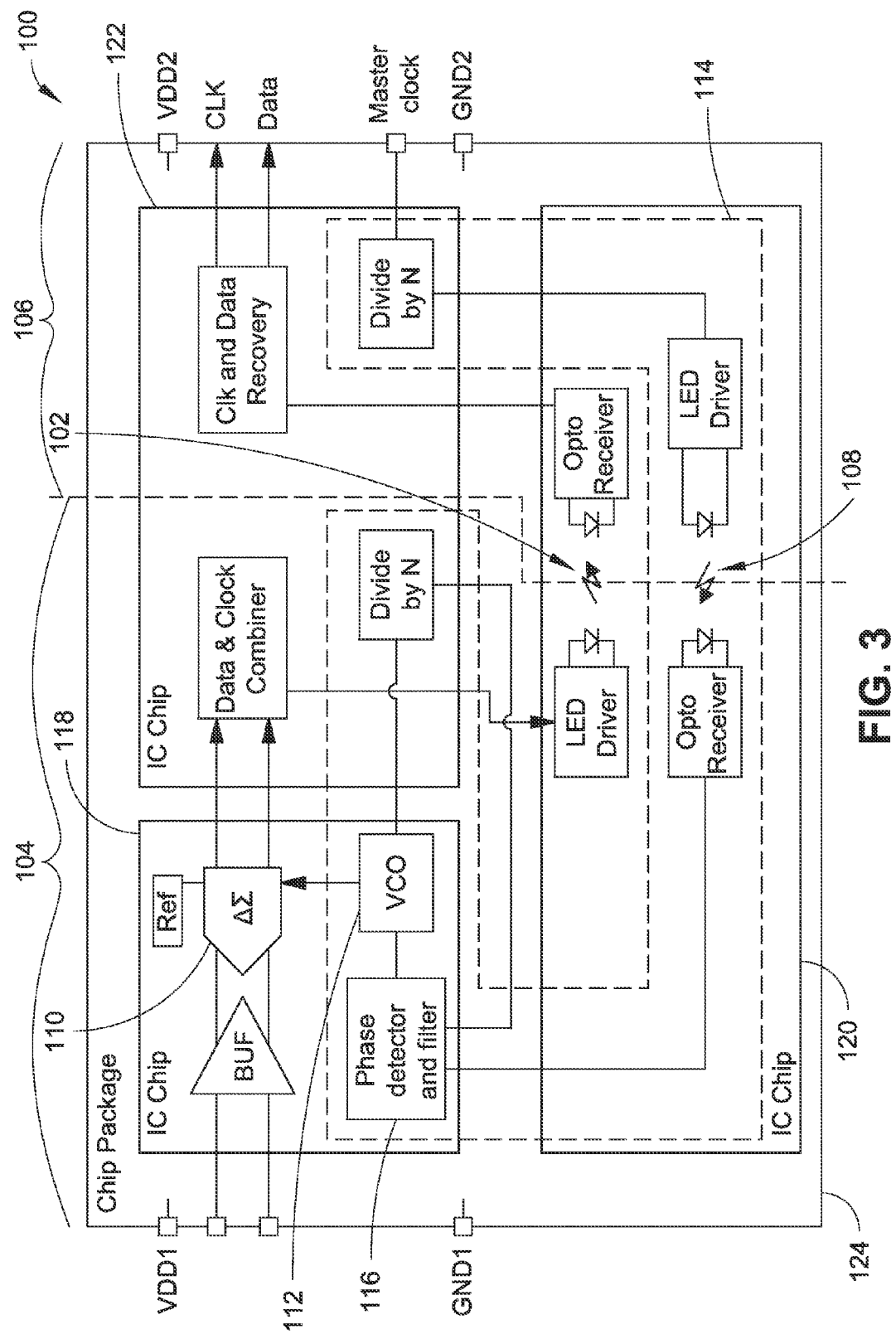
FIG. 3 is a diagrammatic illustration of a chip package that provides electrical isolation using a high speed optical link and a low speed optical link in accordance with an example embodiment of the present disclosure.

Referring generally to FIGS. 2 and 3, a system 100 providing optical coupling is described. The system 100 includes a high speed, unidirectional optical link 102 (e.g., a twenty megahertz (20 MHz) optical link) for transmitting signals from a high voltage side 104 of the system 100 to a low voltage side 106 of the system 100. The system 100 also includes a low speed, low power unidirectional optical link 108 (e.g., a ten kilohertz (10 kHz) optical link) for transmitting signals from the low voltage side 106 to the high voltage side 104. In embodiments of the disclosure, one or more of the optical links 102 and 108 includes a light emitting diode (LED). The high voltage side 104 of the system 100 is configured to couple with, for example, a motor, and the low voltage side 106 of the system 100 is configured to couple with, for example, a controller (e.g., for controlling the speed of the motor). In some embodiments, the high voltage side 104 is coupled with a floating ground. On the high voltage side 104, current-sense functionality is provided using a sigma-delta modulator 110 and an associated oscillator 112. Synchronization of the oscillator 112 is achieved via the low speed optical link 108 that furnishes a clock signal from the low voltage side 106 to the high voltage side 104.

The system 100 described in FIG. 2 implements a reduced backwards clock frequency for the isolated sigma-delta modulator 110 (e.g., with respect to the system 50 described with reference to FIG. 1). In this embodiment, a clock multiplier is coupled with the sigma-delta modulator 110 and a divided clock signal (e.g., a master clock signal) is transmitted to the high voltage side 104 of the system 100 along a low speed, backwards clock path 114 via the low speed optical link 108. The low speed optical link 108 reduces cost and power requirements for the system 100, while increasing the reliability and/or lifespan of the system 100. As shown, an external master clock signal on the low voltage side 106 of the optical isolator is divided by a characteristic value, N. In some embodiments, N is equal to at least approximately $2^{11}$ (2048) and reduces the reverse link speed to at least approximately ten kilohertz (10 kHz).

The divided clock signal is transmitted through the low speed optical link 108, and a clock multiplier (e.g., a high-precision clock multiplier) synchronizes the sigma-delta modulator 110 with the external master clock. This configuration allows for synchronized measurement of shunt current with the master clock from the low voltage side 106 of the system 100.

Referring now to FIG. 3, in some embodiments the sigma-delta modulator 110, the oscillator 112, and phase detector and filter circuitry 116 (e.g., implementing a phase-locked loop (PLL)) are provided on a first integrated circuit (IC) chip 118; the LED drivers, LEDs, and optical receiver circuitry of the optical links 102 and 108 are provided on a second optical isolator IC chip 120; and the divider, clock and data recovery circuitry are provided on a third IC chip 122. The first, second, and third IC chips 118, 120, and 122 are included in a single chip package 124. In this configuration, the alignment of LED transmission and receiver circuitry may not be as critical for the low speed optical link 108 because of its reduced power requirements. For example, when two high speed optical links are provided on a common IC chip as shown in FIG. 1, the alignment of the transmission and receiver circuitry for both optical links 52 and 54 is critical, and often results in a chip that has increased power requirements (e.g., due to a sub-optimal alignment of the optical components on the chip). However, this configuration is provided by way of example only and is not meant to limit the present disclosure. Thus, in other configurations, the circuitry described is included on a single IC chip, is arranged differently on multiple IC chips, and so forth.

In embodiments of the disclosure, systems 100 described herein are used in one or more applications including, but not necessarily limited to: a programmable logic controller (PLC), a motor controller, a medical device, a photovoltaic (PV) solar device, a direct current-to-direct current (DC-to-DC) power inverter, and so forth. For example, the system 100 described with reference to FIGS. 2 and 3 can be implemented in industrial (e.g., industrial control) and/or automation markets. In some embodiments, the system 100 is implemented in a reduced power, optically isolated analog-to-digital (A/D) converter.

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A system comprising: a divider on a first side of electrically isolated circuitry for receiving a clock signal having a characteristic frequency and dividing the clock signal by a characteristic value;
    an optical link coupled with the divider for receiving the divided clock signal and transmitting the divided clock signal from the first side of the electrically isolated circuitry to a second side of the electrically isolated circuitry; and
    phase-locked loop circuitry on the second side of the electrically isolated circuitry, the phase-locked loop circuitry coupled with the optical link and configured to receive the divided clock signal from the optical link and generate a second signal at a multiple of a characteristic frequency of the divided clock signal so that the second signal comprises the characteristic frequency of the clock signal received by the divider circuitry, wherein the phase-locked loop circuitry is disposed on a first integrated circuit chip, the optical link is disposed on a second integrated circuit chip, and the divider is disposed on a third integrated circuit chip, the phase-locked loop circuitry including a phase detector and filter and a voltage controlled oscillator, the voltage controlled oscillator directly coupled to a sigma-delta modulator, the voltage controlled oscillator supplying the second signal to the sigma-delta modulator and a divided feedback signal to the phase detector and filter.

2. The system as recited in claim 1, further comprising a second optical link for transmitting signals from the second side of the electrically isolated circuitry to the first side of the electrically isolated circuitry.

3. The system as recited in claim 2, wherein the speed of the second optical link is greater than the speed of the optical link.

4. The system as recited in claim 1, wherein the first side of the electrically isolated circuitry is configured to operate at a higher voltage than the second side of the electrically isolated circuitry.

5. The system as recited in claim 1, wherein the first integrated circuit chip, the second integrated circuit chip, and the third integrated circuit chip are included in a chip package.

6. The system as recited in claim 1, wherein the clock signal comprises an external master clock signal.

7. A system comprising:
    a divider on a first side of electrically isolated circuitry for receiving a clock signal having a characteristic frequency and dividing the clock signal by a characteristic value;
    a first optical link coupled with the divider for receiving the divided clock signal and transmitting the divided clock signal from the first side of the electrically isolated circuitry to a second side of the electrically isolated circuitry;
    a second optical link for transmitting signals from the second side of the electrically isolated circuitry to the first side of the electrically isolated circuitry; and
    phase-locked loop circuitry on the second side of the electrically isolated circuitry, the phaselocked loop circuitry coupled with the first optical link and configured to receive the divided clock signal from the first optical link and generate a second signal at a multiple of a characteristic frequency of the divided clock signal so that the second signal comprises the characteristic frequency of the clock signal received by the divider circuitry, wherein the phase-locked loop circuitry is disposed on a first integrated circuit chip, the first optical link and the second optical link are disposed on a second integrated circuit chip, and the divider is disposed on a third integrated circuit chip, the phase-locked loop circuitry including a phase detector and filter and a voltage controlled oscillator, the voltage controlled oscillator directly coupled to a sigma-delta modulator, the voltage controlled oscillator supplying the second signal to the sigma-delta modulator and a divided feedback signal to the phase detector and filter.

8. The system as recited in claim 7, wherein the speed of the second optical link is greater than the speed of the first optical link.

9. The system as recited in claim 7, wherein the first side of the electrically isolated circuitry is configured to operate at a higher voltage than the second side of the electrically isolated circuitry.

10. The system as recited in claim 7, wherein the first integrated circuit chip, the second integrated circuit chip, and the third integrated circuit chip are included in a chip package.

11. The system as recited in claim 7, wherein the clock signal comprises an external master clock signal.

12. A chip package comprising:
a first integrated circuit chip comprising a divider on a first side of electrically isolated circuitry for receiving a clock signal having a characteristic frequency and dividing the clock signal by a characteristic value;
a second integrated circuit chip comprising an optical link coupled with the divider for receiving the divided clock signal and transmitting the divided clock signal from the first side of the electrically isolated circuitry to a second side of the electrically isolated circuitry; and a third integrated circuit chip comprising phase-locked loop circuitry on the second side of the electrically isolated circuitry, the phase-locked loop circuitry coupled with the optical link and configured to receive the divided clock signal from the optical link and generate a second signal at a multiple of a characteristic frequency of the divided clock signal so that the second signal comprises the characteristic frequency of the clock signal received by the divider circuitry, the phase-locked loop circuitry including a phase detector and filter and a voltage controlled oscillator, the voltage controlled oscillator directly coupled to a sigma-delta modulator, the voltage controlled oscillator supplying the second signal to the sigma-delta modulator and a divided feedback signal to the phase detector and filter.

13. The chip package as recited in claim 12, further comprising a second optical link for transmitting signals from the second side of the electrically isolated circuitry to the first side of the electrically isolated circuitry.

14. The chip package as recited in claim 12, wherein the speed of the second optical link is greater than the speed of the optical link.

15. The chip package as recited in claim 12, wherein the first side of the electrically isolated circuitry is configured to operate at a higher voltage than the second side of the electrically isolated circuitry.

* * * * *